United States Patent
L'Hostis et al.

(10) Patent No.: US 8,710,917 B2
(45) Date of Patent: Apr. 29, 2014

(54) METHOD AND APPARATUS FOR CONTROLLING POWER SUPPLY

(75) Inventors: Nicolas L'Hostis, Serrieres (FR); Sylvain Engels, Meylan (FR); Fabrice Blisson, Grenoble (FR); ClaireMarie Lachaud, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 13/588,811

(22) Filed: Aug. 17, 2012

(65) Prior Publication Data

US 2013/0043936 A1 Feb. 21, 2013

(51) Int. Cl.
*G05F 1/10* (2006.01)
*H03K 19/00* (2006.01)

(52) U.S. Cl.
CPC ................... *H03K 19/0016* (2013.01)
USPC .......................................................... 327/544

(58) Field of Classification Search
USPC ................. 327/530, 534, 535, 538, 540, 541, 327/543–546
See application file for complete search history.

(56) References Cited

U.S. PATENT DOCUMENTS

2011/0074472 A1* 3/2011 Kawasaki ..................... 327/143

* cited by examiner

*Primary Examiner* — Sibin Chen
(74) *Attorney, Agent, or Firm* — Slater & Matsil, L.L.P.

(57) ABSTRACT

A method for controlling the power supply of an integrated circuit, the power supply comprising a power supply unit powered by a main voltage and possessing several transistor groups, comprising turning on in succession at least two transistor groups in order to deliver, as an output from each group, to at least one part of the integrated circuit, an elementary supply voltage derived from the main voltage, characterized in that the method comprises at least one elementary power phase for supplying power to said at least one part of the integrated circuit, wherein the phase comprises defining voltage thresholds respectively associated with the transistor groups, turning on a first transistor group, the first group delivering a first elementary supply voltage and turning on at least one second group when the first elementary supply voltage is higher than or equal to the voltage threshold associated with the second group.

19 Claims, 3 Drawing Sheets

METHOD AND APPARATUS FOR CONTROLLING POWER SUPPLY

This application claims the benefit of French Patent Application No. 1157367, filed on Aug. 17, 2011, entitled "Digital Control with Analog Detector for Power Switches," which application is hereby incorporated herein by reference.

TECHNICAL FIELD

The present invention relates to a method and apparatus for controlling a power supply of an integrated circuit.

BACKGROUND

In general, when the power switches are located on the periphery, analogue control of the supply voltage is employed, and when they are distributed within the circuit, digital control is employed. In any case, it is useful to limit the current that flows through the power switches. In particular this current should not exceed a maximum value, called the switch-on current, in order to preserve the integrity of the external power supply of the circuit, but also the integrity of the metallization levels of the circuit. It is therefore necessary to control the current delivered by the switches when the circuits are being powered.

In order to control the power supply of the circuit digitally, several groups of power switches are provided for beforehand, during the design phase of the circuit. Next, during operation of the circuit, groups of switches are turned on in succession in order to supply power to the circuit. A first group of switches is turned on first and then, in succession, other groups are turned on. Each turn-on control signal is delivered after a time delay in order to increase the supply voltage gradually. At the end of this power supply process, all the switches are turned on and the voltage delivered to the integrated circuit equals the external supply voltage. Moreover, the time delays are defined during the design phase of the circuit, but such a power supply method does not take into account circuit operating parameters such as temperature variations or the value of the external supply voltage. Since these parameters are not known during the design phase of the integrated circuit, wide operating margins are thus provided during the design phase, thereby making digital control of the power supply of the circuit imprecise.

Currently, integrated circuits possess several parts that do not necessarily operate simultaneously. For example, in a mobile phone the camera function may be off while the music player is on. It is therefore useful to be able to turn off, and then turn back on, part of an integrated circuit, as required.

Currently, integrated circuits are provided with power switches dedicated to supplying power to the various parts of integrated circuits. These switches may be located on the periphery of the circuit to be powered, or they may be distributed within the circuit, i.e. incorporated in the standard cells of the circuit.

SUMMARY OF THE INVENTION

These and other problems are generally solved or circumvented, and technical advantages are generally achieved, by preferred embodiments of the present invention which provide an apparatus method for controlling a power supply of an integrated circuit.

According to one implementation and embodiment, a means is provided for determining the time delays more precisely, while still controlling the switch-on current.

According to another implementation and embodiment, a means is provided for supplying an amount of power suitable for the operating conditions of the integrated circuit, for example suitable for temperature variations or for variations in external supply voltage.

According to one aspect, a method for controlling the power supply of an integrated circuit is thus provided, the power supply comprising a power supply unit powered by a main voltage and possessing several transistor groups, which method comprises turning on in succession at least two transistor groups in order to deliver, as output from each group, to at least one part of the integrated circuit, an elementary supply voltage derived from the main voltage.

The method furthermore comprises at least one elementary power phase for supplying power to said at least one part of the integrated circuit, which phase comprises:

a) defining voltage thresholds respectively associated with the transistor groups;

b) turning on a first transistor group, the first group delivering a first elementary supply voltage; and c) turning on at least one second group when the first elementary supply voltage is higher than or equal to the voltage threshold associated with the second group.

Thus the elementary supply voltages are used to precisely control the power supplied to the circuit. In particular, the operating conditions of the integrated circuit are taken into account when controlling the power supply of the circuit part.

The number of groups may be greater than two and said at least one elementary power phase may furthermore comprise, after step c):

d) turning on the following group when the last elementary voltage delivered by the group turned on last is higher than or equal to the voltage threshold associated with said following group; and e) repeating step d) until all the transistor groups have been turned on.

Said at least one elementary power phase may furthermore comprise, after step b), and during each step of turning on a transistor group, at least one recording of a time delay associated with the turn-on of the transistor group and proportional to a time period between the turn-on of the group and the turn-on of the preceding group, the method furthermore comprising at least one time-delay-controlled power phase comprising:

a) turning on the first transistor group; and b) turning on said at least one second group after a time period longer than or equal to the time delay associated with the turn-on of said at least one second group.

Thus, the values of the time delays may be recorded during a first elementary power phase, and then be used directly to power the circuit more rapidly in time-delay-controlled power phases.

As variants, the time delays recorded could be either the time period between the turn-on of one group and the turn-on of the preceding group or the time period between the turn-on of one group and the turn-on of the first group.

Advantageously, when time-delay-controlled power phases are implemented, it is not necessary to carry out steps of defining voltage thresholds.

Said at least one time-delay-controlled power phase may comprise, after step b):

c) turning on the following group after a time period longer than or equal to the time delay associated with the turn-on of the following group; and d) repeating step c) until all the transistor groups have been turned on.

The method may comprise several elementary power phases and/or several time-delay-controlled power phases.

Thus, the circuit is powered either in elementary power phases based on detection of voltage thresholds, or in time-delay-controlled power phases. In particular, before the time-delay-controlled power phases at least one elementary power phase has been implemented in which time delays associated with turning the transistor groups on are recorded.

According to another aspect, a device for controlling the power supply of an integrated circuit is provided, the power supply comprising a power supply unit intended to be powered by a main voltage and possessing several transistor groups, which device comprises a control stage configured to control the turn-on of at least two transistor groups in succession in order to deliver, as output from each group, to at least one part of the integrated circuit, an elementary supply voltage derived from the main voltage.

The device furthermore comprises a detection stage, comprising:

defining means able to define voltage thresholds respectively associated with the transistor groups; and comparing means configured to compare an elementary supply voltage delivered by the group turned on last with the voltage threshold associated with the following transistor group, and the control stage is configured to control the turn-on of a transistor group when the elementary supply voltage delivered by the group turned on last is higher than or equal to the voltage threshold associated with said transistor group.

The control stage may comprise recording means configured to record several time delays respectively associated with the turn-on control signals of the transistor groups, each time delay being proportional to a time period between the associated turn-on control signal and the preceding turn-on control signal, and the control stage is furthermore configured to control each turn-on of a transistor group after a time period longer than or equal to the time delay associated with the turn-on control signal of the group.

The means for defining voltage thresholds may comprise several arrays of other transistors identical to the transistors in the groups and the control stage is furthermore configured to control the turn-on of a transistor array associated with a transistor group in order to define the voltage threshold associated with the transistor group.

The detection stage may comprise a reference grouping comprising at least one reference transistor intended to pass a saturation current and connected to the transistor arrays so that each voltage threshold defined corresponds to a fraction of the saturation current.

The detection stage may comprise two transistors forming a current mirror, the transistors of the transistor arrays being connected to the second transistor of the current mirror and said at least one reference transistor being connected to the first transistor of the current mirror.

The number of transistors in the reference grouping may be lower than or equal to the number of transistors in the first transistor group.

Preferably, the number of transistors in the reference grouping is lower than that in the first group of the power supply unit, so as to limit the power consumption of the detection stage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present disclosure will be described with respect to embodiments in a specific context, a method for controlling a power supply of an integrated circuit. The embodiments of the disclosure may also be applied, however, to a variety of integrated circuits. Hereinafter, various embodiments will be explained in detail with reference to the accompanying drawings.

Figure 1:
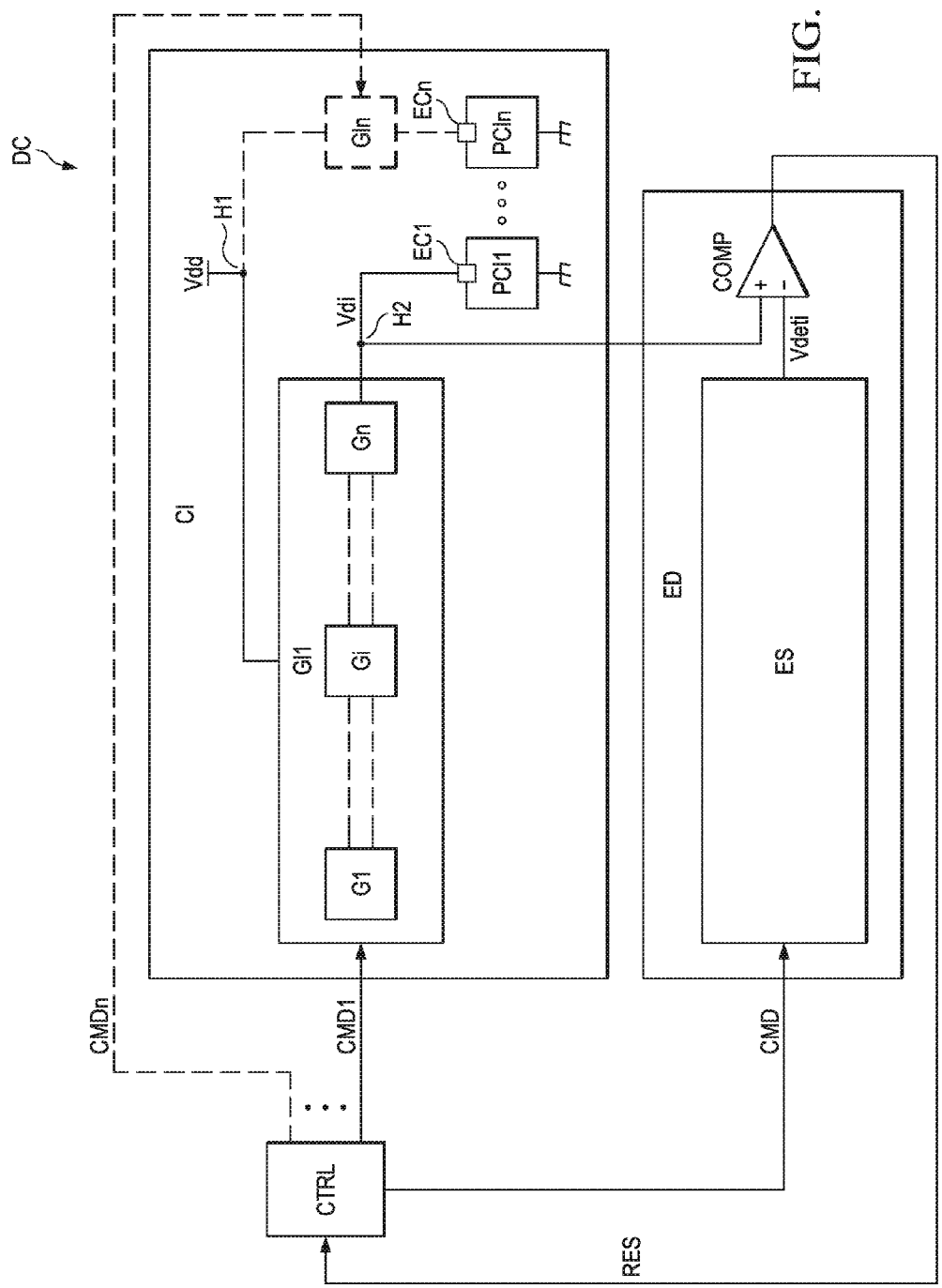
FIG. 1 illustrates schematically one embodiment of a device according to the invention.

FIG. 1 shows a diagram of a control device for controlling a power supply of an integrated circuit in accordance with an embodiment. The integrated circuit CI comprises several circuit parts such as PCI1, . . . , PCIn. The circuit parts may each represent, for example, one function of the circuit CI, such as a video function or a music player. The parts PCI1, . . . , PCIn of the integrated circuit CI are intended to be supplied with a main voltage Vdd by way of, as will be seen in greater detail below, respective power supply units GI1, . . . , GIn.

The control device DC comprises, in this respect, one control stage CTRL and one detection stage ED per power supply unit GIi. Each power supply unit GIi is associated with one part PCIi of the integrated circuit and allows the power supplied to this part to be controlled. The power supply units GI1, . . . , GIn are preferably integrated into the circuit CI, but they may also be produced on the periphery of the integrated circuit CI. Each power supply unit such as GI1, . . . , GIn comprises several groups of power switches, which are referred to as G1, . . . , Gn respectively. The power switches (e.g., switch G1) are, for example, pMOS transistors. The control device DC comprises a main supply terminal H1 that delivers a main voltage Vdd. Each power supply unit GIi is connected to the main supply terminal H1 and delivers an elementary supply voltage Vdi to the terminal ECi of the circuit part PCIi, which is associated with the terminal ECi.

The control stage CTRL is connected to each of the power supply units and is configured to control all the transistors of each of the power supply units via a control signal CMDi. Each control signal CMDi for a power supply unit may, for example, be a digital word that controls the state of each transistor of the power supply unit. The control stage CTRL may be produced in the conventional way using logic circuits, or by software means within a processor.

In the following, the operation of a single power supply unit will be described, in this case the unit GI1 associated with its detection stage ED, though of course it will be understood that other power supply units operate analogously when present.

Depending on the need, it may or may not be desired to turn on, for example, part PCB of the integrated circuit CI in order to decrease the power consumed by the integrated circuit CI. The transistors of the unit GI1 allow the power supplied to the part PCI1 of the integrated circuit CI to be stopped when the transistors of the unit GI1 are all turned off.

On the other hand, the control stage CTRL can control the turn-on of the transistors of the unit GI1 in order to supply the circuit part PCB with power by delivering the elementary supply voltage Vdi as an output from the unit GI1. The elementary supply voltage Vdi varies as a function of the number of transistors made to conduct. Furthermore, the elementary supply voltage Vdi is based on the main voltage Vdd. In order to prevent the level of the main voltage Vdd from varying, the control stage CTRL turns on the transistors in groups. This is because the main voltage Vdd is intended to supply other parts of the integrated circuit and it is necessary to keep the main voltage level Vdd as constant as possible.

The instantaneous current Ion injected into the output H2 of the unit GI1 especially depends on the number and characteristics of the transistors (e.g., G1, ..., Gn) of the unit GI1 and further depends on the elementary supply voltage Vdi at the moment when a group of transistors (e.g., G1, ..., Gn) may be turned on. In order to limit variations in the level of the main power supply, the instantaneous current Ion injected into H2 is kept below a current threshold Ionref, which is commonly known as a switch-on current. The switch-on current Ionref corresponds to the instantaneous current delivered when only the first transistor group G1 is turned on.

Initially, all the groups G1, ..., Gn of the unit GI1 are in the off-state. In other words, the part PCI1 of the integrated circuit is not being supplied with power. In order to supply the part PCB of the integrated circuit with power, the transistor groups G1, ... Gn are turned on one after another so as to gradually vary the elementary supply voltage Vdi. The expression "a group G1 of transistors is turned on" is understood here to mean that the control device CTRL transmits a control signal making all the transistors in the group G1 conduct.

In order to control the supply of power to the part PCI1 of the integrated circuit, the first transistor group G1 is turned on to begin with and then each of the other groups is turned on in succession, when the value of the elementary supply voltage Vdi exceeds a voltage threshold Vdeti associated with the next group to be turned on.

Several voltage thresholds Vdeti associated with the transistor groups G1, respectively, are therefore defined. Since the first group G1 is systematically turned on, it may be considered to have an associated zero voltage threshold.

The voltage thresholds Vdeti are chosen so that the current Ion delivered by the transistors that are turned on does not exceed the switch-on current Ionref. The value of the reference current Ionref depends, especially, on the characteristics and number of transistors W in the first group G1.

Generally, a voltage threshold Vdeti corresponds to the elementary supply voltage Vdi delivered when one or more transistor groups are turned on. The instantaneous current Ion associated with this elementary supply voltage Vdi (in this case Vdi=Vdeti) is equal to a certain percentage Zi of the reference current Ionref.

The voltage thresholds Vdeti therefore correspond to a certain percentage Zi of the reference current Ionref. When the power supply unit GI1 comprises four transistor groups, three voltage thresholds Vdet2, ..., Vdet4 associated with the three groups G2, ..., G4, respectively, are defined. It would, for example, be possible to choose a Vdet2 value corresponding to Ionref/2, a Vdet3 value corresponding to Ionref/4 and a Vdet4 value corresponding to Ionref/10. If the power supply unit GI1 comprises six transistor groups, five voltage thresholds Vdet2, ..., Vdet6 associated with the five groups G2, ..., G6, respectively, are defined. It would, for example, be possible to choose a Vdet2 value corresponding to 2Ionref/3, a Vdet3 value corresponding to Ionref/2, a Vdet4 value corresponding to Ionref/4, a Vdet5 value corresponding to Ionref/10 and a Vdet6 value corresponding to Ionref/20.

Figure 2:
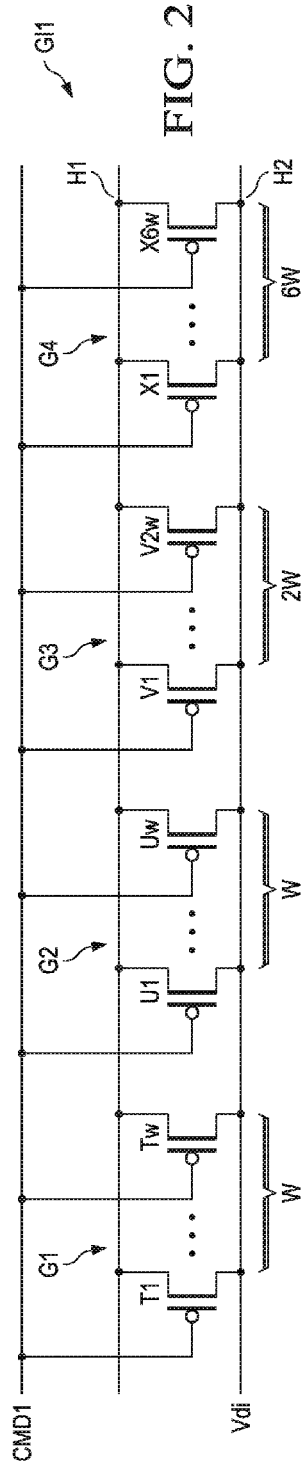
FIG. 2 illustrates schematically one embodiment of the transistor groups.

FIG. 2 illustrates an exemplary embodiment of the power supply unit. The exemplary embodiment the unit GI1 comprises four transistor groups G1 to G4. A first group G1 comprises an integer number W of transistors referenced T1 to TW. A second group G2 comprises an identical number W of transistors referenced U1 to UW. A third group G3 comprises a number equal to 2 W of transistors referenced V1 to V2W. A fourth group G4 comprises a number equal to 6 W of transistors referenced X1 to X6W. All the transistors of the unit G1 are connected in parallel between the main supply terminal H1, also called the first node, and the output of the power supply unit GI1 (a.ka. a second node H2). As shown in FIG. 2, this second node H2 is connected to the terminal EC1 of the circuit part PCI1.

Referring back to FIG. 1, the detection stage ED comprises a defining stage ES and a comparator COMP. The defining stage ES allows voltage thresholds Vdeti to be defined. In accordance with an embodiment, the thresholds are used for a first input of the comparator COMP. The comparator COMP comprises a second input connected to the second node H2 and allows the elementary supply voltage Vdi to be compared with the voltage thresholds Vdeti. The result of the comparison RES is then transmitted to the control stage CTRL.

Thus, the detection stage ED allows analogous detection of the value of the elementary supply voltage Vdi delivered by the transistors of the grouping GI1. Determining which transistors are made to conduct is implemented by comparing the supply voltage Vdi with the various defined voltage thresholds Vdeti. The result RES is then used by the control stage CTRL to control the turn-on of the transistors as a function of the value of the elementary supply voltage Vdi.

Initially, all the transistors of the grouping GI1 are turned off and the value of the elementary supply voltage Vdi is zero. When it is desired to supply power to the circuit part PCI1, the control stage CTRL sends a first turn-on control signal F1 in order to turn on all the transistors in the first group G1. The elementary supply voltage Vdi then increases, and when it exceeds a voltage threshold Vdeti, the control stage CTRL sends a second turn-on control signal F2 in order to turn on all the transistors in the second group G2. Before each turn-on of a transistor group Gi, the detection stage ED compares the value of the elementary supply voltage Vdi with the voltage threshold Vdeti associated with the transistor group G1 to be turned on, and the control stage CTRL turns the transistor group G1 on when the value of the elementary supply voltage Vdi exceeds the voltage threshold Vdeti. The voltage Vdi increases after each turn-on of a transistor group G1, and after all the groups G1, ..., Gn have been turned on, the supply voltage Vdi equals the main voltage Vdd.

The number of transistors in the various transistor groups G1, ..., Gn is defined depending on the voltage thresholds Vdeti chosen. As a result, the instantaneous current Ion is always lower than or equal to the switch-on current Ionref. For example, the number of transistors may be defined so that when a transistor group is turned on the instantaneous current Ion delivered is at most equal to the switch-on current Ionref.

After the first group G1 has been turned on, the voltage Vdi increases from 0 to Vdd and the instantaneous current injected into H2 decreases from Ionref to 0. When the value of the elementary supply voltage Vdi is higher than or equal to the threshold Vdet2, i.e. the instantaneous current Ion is lower than or equal to Ionref/2 (when the power supply unit GI1 comprises four transistor groups), the second group G2 is turned on so as to inject at most two times Ionref/2 into H2, so as not to exceed Ionref. When the second group is turned on, the instantaneous currents delivered by the two groups are added together. Thus, if G1 comprises W transistors, then the second group G2 comprises the same number W of transistors as the first group G1.

Generally, the number of transistors in a group may be chosen so that Equation 1 below is satisfied:

$$\sum_{j=1}^{j=i-1} W_{Gj} + W_{Gi} = W_{G1}/ZRi \quad \text{(Equation 1)}$$

$$\text{Hence } W_{Gi} = W_{G1}/ZRi - \sum_{j=1}^{j=i-1} W_{Gj} \quad \text{(Equation 2)}$$

where $W_{Gi}$: is the number of transistors in the group Gi to be turned on;

$W_{G1}$: is the number of transistors in the first group;

ZRi: is the fraction of the reference current Ion, this fraction being associated with the voltage threshold Vdeti associated with the transistor group Gi to be turned on; and $$\sum_{j=1}^{j=i-1} W_{Gj}:$$

is the sum of the number of transistors in the preceding groups that have been turned on, and where i and j are integers and $W_{Gi}$ is the number of transistors in a group Gj of the power supply unit GI1.

According to Equation 2, the third group G3 having an associated voltage threshold equal to Vdet3 corresponding to Ionref/4 (Z3=25% of Ionref or to the fraction ZR3=1/4) has a number of transistors $W_{G3}$=W/ZR3−2 W=2 W.

The control stage CTRL may furthermore comprise recording means for recording time periods, called time delays, proportional to the time period between two successive turn-ons of the transistor groups. Thus, in a first elementary power phase for supplying power to the part PCI1 of the circuit CI, the values of the elementary supply voltage Vdi are compared with voltage thresholds for turning on the transistor groups and time delays are recorded between two successive turn-ons. Next, in a subsequent power phase for supplying power to the part PCI1 of the circuit, the detection stage ED is no longer necessary and the control stage CTRL may turn the groups on based on the recorded time delays. In this case, the detection stage ED may be deactivated, i.e. not supplied with power.

Figure 3:
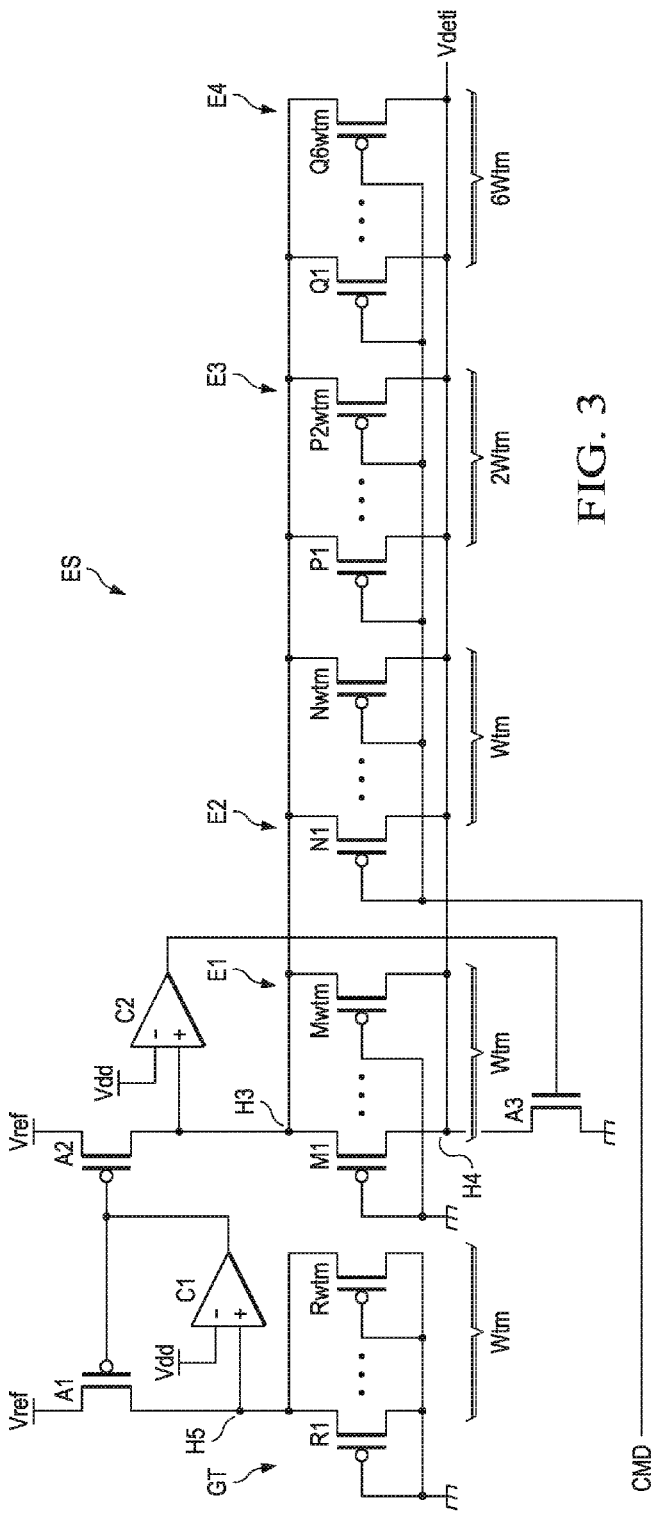
FIG. 3 illustrates schematically one embodiment of the detection stage.

FIG. 3 shows a diagram of one embodiment of the stage for defining voltage thresholds. The defining stage ES comprises transistor arrays E1 to E4. The transistors of the arrays Ei are connected in parallel between a third node H3 and a fourth node H4.

The third node H3 is connected to the + input of a comparator C2, the − input of which is connected to Vdd. The output of the comparator C2 is connected to the gate of an nMOS transistor A3 that is connected in series between ground and the node H4. In the steady state the comparator C2 allows the voltage of the node H3 to be set to Vdd.

Moreover, the defining stage ES comprises a reference group GT that comprises a number Wtm of reference transistors R1, ..., Rwtm. The reference transistors R1, ..., Rwtm are connected in parallel between a fifth node H5 and ground. Moreover, the current that flows through the transistors in the reference group corresponds to a saturation current Isat. The saturation current Isat depends, especially, on the number of transistors Wtm and is proportional to the reference current Ionref. The saturation current Isat may be equal to the reference current Ionref if the reference grouping GT and the first transistor group G1 have the same number of transistors. In order to limit the power consumed by the defining stage ES, the number Wtm of reference transistors in the grouping GT is smaller than the number W of transistors in the first group G1, such that Ionref/Isat=W/Wtm. Preferably the reference grouping GT comprises a single transistor R1.

A current mirror including transistors A1 and A2 allows the saturation current Isat to be copied and injected into the third node H3. In the steady state, another comparator C1, connected between the node H5 and the current mirror including transistors A1 and A2, allows the voltage of the fifth node H5 to be set to Vdd. Preferably, the value of the voltage Vref supplied to the current mirror A1, A2 is higher than that of the main voltage Vdd so as to guarantee that the voltage delivered to the nodes H3 and H5 is equal to Vdd.

The first array E1 comprises transistors that are all permanently-on transistors. Preferably, these transistors are pMOS transistors and they all have their gate grounded. The transistors of the other arrays E2 to E4 have a control signal CMD delivered to their gate by the control stage CTRL in order to define the various voltage thresholds. The arrays E1 to E4 respectively contain transistors that are identical to the transistors in the groups G1 to G4 (on the assumption that the unit GI1 comprises four groups G1-G4).

The expression "identical transistors" is understood here to mean transistors of the same type, i.e. pMOS or nMOS transistors, having the same gate length but not necessarily the same gate width. Preferably the gate width of the transistors in the defining stage ES is smaller than that of the transistors of the power supply units GIi, in order to limit the footprint and the power consumption of the detection stage ED.

When the power supply unit GI1 comprises four transistor groups, three voltage thresholds Vdet2, Vdet3, Vdet4 are defined using the three controlled transistor arrays E2 to E4. The first array E1 comprises an integer number Wtm of transistors referenced M1 to Mwtm. The second array E2 comprises an identical number Wtm of transistors referenced N1 to Nwtm. The third array E3 comprises a number equal to 2Wtm of transistors referenced P1 to P2*wtm*. The fourth array E4 comprises a number equal to 6Wtm transistors referenced Q1 to Q6wtm. It should be noted that the ratios of the numbers of transistors of the transistor arrays E1 to E4 are identical to the ratios of the numbers of transistors in the transistor groups G1 to G4.

Each voltage threshold is defined in succession by turning on a transistor array Ei. The first transistor group G1 may, for example, be considered not to have an associated voltage threshold; in this case the transistors of the first array E1 are all permanently-on transistors.

To define, for example, the voltage threshold Vdet2 associated with the second group G2, the control signal CMD is used to turn on the transistors of the second array E2. The saturation current Ionreftm injected into the node H3 flows through the various transistors of the arrays E1 and E2. Since the number of transistors made to conduct in the arrays E1 and E2 (Wtm+Wtm) is two times greater than the number of transistors (Wtm) in the reference grouping GT, the voltage threshold Vdet2 corresponds to Z2=50% of the saturation current Isat, and thus to 50% of Ionref since the transistors of the arrays E1 to E4 are identical to those in the groups G1 to G4. To define the voltage threshold Vdet3 associated with the third group G3, the control signal CMD is used to turn on the transistors of the third array E3. To define the voltage threshold Vdet4 associated with the fourth group G4, the control signal CMD is used to turn on the transistors of the fourth array E4.

Figure 4:
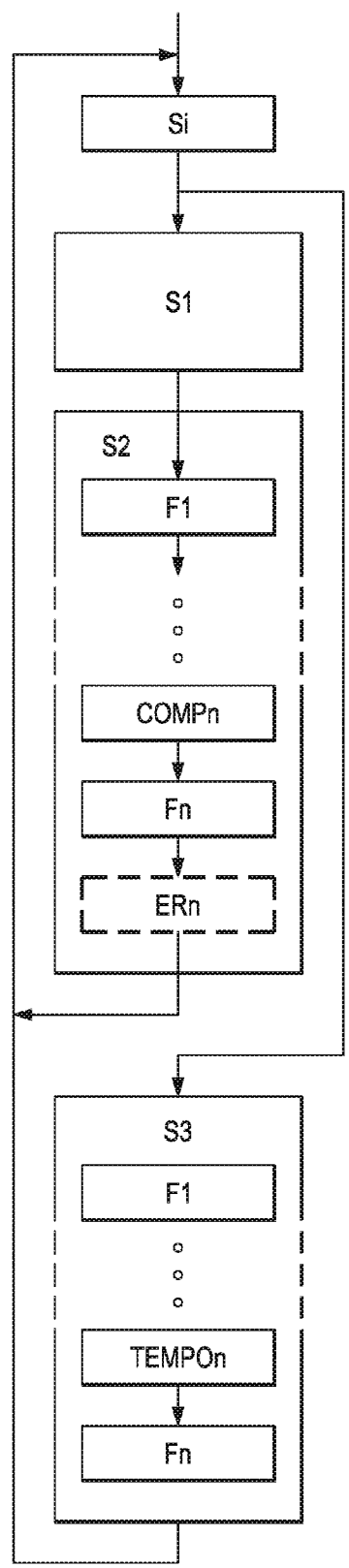
FIG. 4 illustrates schematically the main steps in one implementation of the method according to the invention.

FIG. 4 shows an implementation of a power supply method for an integrated circuit CI in accordance with an embodiment. This method may be implemented by the device described above. The method comprises a reset step S1 in which all the transistors in the transistor groups are turned off. In a first step S1, voltage thresholds associated with the transistor groups are defined. Next, in an elementary power phase S2, part PCI1 of the integrated circuit is supplied with power. The phase S2 comprises turning on F1, . . . , Fn the transistor groups in succession.

The elementary power phase S2 furthermore comprises first turning on F1 the first transistor group G1, then, before each turn-on of a subsequent transistor group, comparing the elementary supply voltage Vdi delivered by the transistors of the groups that have been made to conduct with the voltage threshold associated with the next group to be turned on. Steps of turning on the groups are carried out when the elementary supply voltage Vdi exceeds the voltage threshold associated with the next group to be turned on.

The elementary power phase may furthermore comprise steps ER2, . . . , ERn of recording a time period between two turning-on steps, this time period being called a time delay TEMPOi. Each recording step ERi is carried out, after the first turn-on F1, each time a subsequent transistor group is turned on Fi.

After the phase S2, a decision may be made to stop the supply of power to the part PCI1 of the integrated circuit by again carrying out the initialization step Si. Next, when it is once more desired to supply power to the part PCI1 of the integrated circuit CI, it is possible to choose to implement either a phase S2 in which the transistor groups are turned on depending on the value of the elementary supply voltage Vdi or a power phase S3 controlled by the recorded time delays. The power phase S3 also comprises turning on the first transistor group, then turning on F2, . . . , Fn the following transistor groups in succession, each turn-on of a subsequent group being carried out after a time period longer than or equal to the recorded time delay TEMPOi associated with the turn-on Fi.

By virtue of the method and device described above, a robust and precise means is provided for supplying power, as required, to the parts of an integrated circuit. Furthermore, this means is rapid and responds in real time to the operating conditions of the circuit. Such a means moreover allows the maximum power supplied to the circuit to be controlled. The device thus provided is also sufficiently small to be produced within an integrated circuit.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for controlling a power supply of an integrated circuit, the power supply comprising a power supply unit powered by a main voltage and possessing a number of transistor groups, comprising:
    turning on in succession at least two transistor groups in order to deliver, as an output from each group, to at least one part of the integrated circuit, an elementary supply voltage derived from the main voltage, characterized in that the method comprises at least one elementary power phase for supplying power to said at least one part of the integrated circuit, wherein the phase comprises:
    defining voltage thresholds respectively associated with the transistor groups;
    turning on a first transistor group, the first group delivering a first elementary supply voltage; and
    turning on at least one second group when the first elementary supply voltage is higher than or equal to the voltage threshold associated with the second group.

2. The method of claim 1, wherein the number of transistor groups is greater than two.

3. The method of claim 1, further comprising:
    after the step of turning on at least one second group when the first elementary supply voltage is higher than or equal to the voltage threshold associated with the second group, turning on the following group when a last elementary voltage delivered by the group turned on last is higher than or equal to the voltage threshold associated with said following group.

4. The method of claim 3, further comprising:
    repeating the step of turning on the following group when the last elementary voltage delivered by the group turned on last is higher than or equal to the voltage threshold associated with said following group until all the transistor groups have been turned on.

5. The method of claim 4, wherein said at least one elementary power phase furthermore comprises, after the step of turning on a first transistor group, the first group delivering a first elementary supply voltage and during each step of turning on a transistor group, at least one recording of a time delay associated with a turn-on of the transistor group and proportional to a time period between the turn-on of the group and the turn-on of the preceding group, the method furthermore comprising at least one time-delay-controlled power phase comprising:

turning on the first transistor group; and turning on said at least one second group after a time period longer than or equal to the time delay associated with the turn-on of said at least one second group.

6. The method of claim 1, wherein said at least one elementary power phase furthermore comprises, after the step of turning on a first transistor group, the first group delivering a first elementary supply voltage and during each step of turning on a transistor group, at least one recording of a time delay associated with a turn-on of the transistor group and proportional to a time period between the turn-on of the group and the turn-on of the preceding group, the method furthermore comprising at least one time-delay-controlled power phase comprising:

turning on the first transistor group; and turning on said at least one second group after a time period longer than or equal to the time delay associated with the turn-on of said at least one second group.

7. The method of claim 6, wherein the number of groups is higher than two and said at least one time-delay-controlled power phase furthermore comprises:

after the step of turning on a first transistor group, the first group delivering a first elementary supply voltage, turning on the following group after a time period longer than or equal to the time delay associated with the turn-on of the following group.

8. The method of claim 7, further comprising:

repeating the step of turning on the following group after a time period longer than or equal to the time delay associated with the turn-on of the following group until all the transistor groups have been turned on.

9. The method of claim 1, wherein the method comprises a plurality of elementary power phases.

10. The method of claim 1, wherein the method comprises a plurality of time-delay-controlled power phases.

11. A device for controlling a power supply of an integrated circuit, the power supply comprising a power supply unit intended to be powered by a main voltage and possessing several transistor groups, which device comprises a control stage (CTRL) configured to control a turn-on of at least two transistor groups in succession in order to deliver, as output from each group, to at least one part of the integrated circuit, an elementary supply voltage derived from the main voltage, characterized in that it comprises a detection stage, comprising:

a defining stage able to define voltage thresholds respectively associated with the transistor groups; and a comparator configured to compare an elementary supply voltage delivered by the group turned on last with the voltage threshold associated with the following transistor group, and in that the control stage is furthermore configured to control the turn-on of a transistor group when the elementary supply voltage delivered by the group turned on last is higher than or equal to the voltage threshold associated with said transistor group.

12. The device of claim 11, wherein the control stage comprises recording means configured to record several time delays respectively associated with turn-on control signals of the transistor groups, each time delay being proportional to a time period between an associated turn-on control signal and a preceding turn-on control signal, and the control stage is furthermore configured to control each turn-on of a transistor group after a time period longer than or equal to the time delay associated with the turn-on control signal of the group.

13. The device of claim 11, wherein the defining stage for defining voltage thresholds comprise several arrays of other transistors identical to the transistors in the groups and the control stage is furthermore configured to control the turn-on of a transistor array associated with a transistor group in order to define the voltage threshold associated with the transistor group.

14. The device of claim 11, wherein the detection stage comprises a reference grouping comprising at least one reference transistor intended to pass a saturation current and connected to transistor arrays so that each voltage threshold defined corresponds to a fraction of the saturation current.

15. The device of claim 14, wherein the detection stage comprises two transistors forming a current mirror, the transistors of the transistor arrays being connected to a second transistor of the current mirror and said at least one reference transistor being connected to a first transistor of the current mirror.

16. The device of claim 14, wherein a number of transistors in the reference grouping is lower than or equal to a number of transistors in a first transistor group.

17. A system comprising:

a power supply, wherein the power supply is powered by a main voltage source, and wherein the power supply comprises several transistor groups;

an integrated circuit coupled to and supplied by the power supply;

a control stage configured to control a turn-on of at least two transistor groups in succession in order to deliver, as output from each group, to at least one part of the integrated circuit;

an elementary supply voltage derived from the main voltage; and a detection stage, wherein the detection stage comprising:

a defining stage able to define voltage thresholds respectively associated with the transistor groups; and a comparator configured to compare an elementary supply voltage delivered by the group turned on last with the voltage threshold associated with the following transistor group, and in that the control stage is furthermore configured to control the turn-on of a transistor group when the elementary supply voltage delivered by the group turned on last is higher than or equal to the voltage threshold associated with said transistor group.

18. The system of claim 17, wherein a number of the transistor groups is greater than two.

19. A device for controlling a power supply of an integrated circuit, the power supply comprising a power supply unit intended to be powered by a main voltage and possessing several transistor groups, which device comprises a control stage configured to control a turn-on of at least two transistor groups in succession in order to deliver, as output from each group, to at least one part of the integrated circuit, an elementary supply voltage derived from the main voltage, characterized in that it comprises a detection stage, comprising:

defining means able to define voltage thresholds respectively associated with the transistor groups; and comparing means configured to compare an elementary supply voltage delivered by the group turned on last with the voltage threshold associated with the following transistor group, and in that the control stage is furthermore configured to control the turn-on of a transistor group when the elementary supply voltage delivered by the group turned on last is higher than or equal to the voltage threshold associated with said transistor group.

* * * * *

UNITED STATES PATENT AND TRADEMARK OFFICE
CERTIFICATE OF CORRECTION

PATENT NO.         : 8,710,917 B2
APPLICATION NO.    : 13/588811
DATED              : April 29, 2014
INVENTOR(S)        : Nicolas L'Hostis Page 1 of 1

It is certified that error appears in the above-identified patent and that said Letters Patent is hereby corrected as shown below:

In the Claims

In Col. 11, line 38, claim 11, delete "(CTRL)".

Signed and Sealed this
First Day of July, 2014

Michelle K. Lee
*Deputy Director of the United States Patent and Trademark Office*